US006005305A

United States Patent [19]

Turchi

[11] Patent Number: 6,005,305

[45] Date of Patent: Dec. 21, 1999

[54] MAGNETIC VOLTAGE-PULSER

[75] Inventor: Peter J. Turchi, Worthington, Ohio

[73] Assignee: The United States of America as represented by the Secretary of the Air Force, Washington, D.C.

[21] Appl. No.: 08/910,058

[22] Filed: Aug. 12, 1997

[51] Int. Cl.[6] .................. H03K 3/00

[52] U.S. Cl. .................. 307/106

[58] Field of Search .................. 307/106; 89/8; 124/3; 376/125, 146, 147; 976/DIG. 1, DIG. 3

[56] References Cited

U.S. PATENT DOCUMENTS

| | | | |
|---|---|---|---|
| 3,564,305 | 2/1971 | Cummings | 307/106 |
| 4,735,762 | 4/1988 | Lasche | 376/146 |
| 5,059,839 | 10/1991 | Rose et al. | 89/8 |
| 5,483,863 | 1/1996 | Dreizin | 89/8 |

*Primary Examiner*—Richard T. Elms
*Attorney, Agent, or Firm*—William G. Auton

[57] ABSTRACT

For several years, there has been interest in obtaining fast-rising, high-voltage pulses to drive particle-beam diodes and antennas in mobile situations. The Magnetic Voltage-Pulser (MVP) is a new device to satisfy this interest. The regime of operation of the basic unit comprises—output voltage=0.2 to 1.0 MV, pulse duration=1 microsec, and load impedance=1 to 10 ohms. For higher voltage and higher impedance needs, a plurality of pulsers can be used in a series-parallel arrangement. Typical dimensions for the basic pulser are: length=20 cm, and diameter=15 cm. The weight of the system will vary with the details of the technical approach selected for each application. Also, the basic arrangement can be used for single-shot or repetitive operation by selecting options in the technical details. The repetition rate can exceed 10 kHz. Typical applications include high-power microwave and other electronic warfare devices.

7 Claims, 3 Drawing Sheets

MAGNETIC VOLTAGE-PULSER

STATEMENT OF GOVERNMENT INTEREST

The invention described herein may be manufactured and used by or for the Government for governmental purposes without the payment of any royalty thereon.

BACKGROUND OF THE INVENTION

The present relates generally to magnetic flux compression generators, and more specifically the invention pertains to a magnetic voltage purser design.

MCG's also known as Flux Compression Generators, are usually explosively driven devices capable of generating tens of kilovolts at millions of amperes on a time scale of tens of microseconds. These performance figures are typical and particular designs may vary considerably from the numbers quoted. Other similar sources include capacitive energy storage banks. The simple generic consists of an inductor or coil through which a priming current is circulated by means of a low power source. The priming current establishes a seed magnetic field in the coil. A specially shaped explosive charge is arranged about the coil in such a manner as to compress the coil upon detonation. The seed flux is trapped in the coil and is thus compressed with the coil. The work done by the explosive in compressing the seed flux and the coil corresponds to a conversion of the explosive energy into electrical energy in the circuit.

Conventional techniques for generating fast-rising, high-voltage pulses generally involve high-voltage capacitors and a plurality of high-voltage, closing-switches in arrangements such as Marx generators. High voltages are also generated from lower voltage pulses by means of transformers. In this case, the output pulse generally follows the risetime and duration of the input pulse.

The task of providing a magnetic pulse generator for generating fast-rising, high-voltage pulses for high impedance loads is alleviated, to some extent by the systems disclosed in the following U.S. patents, the disclosures of which are incorporated herein by reference:

U.S. Pat. No. 4,484,090 issued to Wiegand et al;

U.S. Pat. No. 3,636,313 issued to Markowitz;

U.S. Pat. No. 4,229,700 issued to Greene;

U.S. Pat. No. 5,526,213 issued to MacLauchian et al.

The above cited patents disclose magnetic pulse generators, electromagnetic pulse generators, explosive pulse generators and neutron pulse generators that may be used as elements of the present invention. A need remains for providing a magnetic pulse generator for generating fast-rising, high-voltage pulses for high impedance loads to drive particle beam diodes and antennas in mobile situations. The present invention is intended to satisfy that need.

SUMMARY OF THE INVENTION

The present invention is a magnetic voltage-pulser (MVP) to drive high impedance loads, such as high power microwavegenerators, particle-beam diodes and antennas using: a power source that produces a seed current and a seed magnetic field; a multi turn coil that produces an output pulse when cut by magnetic flux; an imploding armature that surrounds the multi-turn coil and a means of imploding the annular armature. Implosion of an electrically-conducting cylinder ("armature") compresses magnetic flux in an area surrounding a multi-turn, solenoidal coil. The rate-of-increase of axial magnetic field due to flux compression induces a high voltage difference between the ends of the coil. The risetime of the voltage is scaled by the coil radius divided by the armature speed. Solid-density armatures driven by gas pressure due to explosive burning can attain speeds of a few km/sec, providing microsecond risetimes with coils of several mm diameter. Metal or plasma armatures driven electromagnetically (by either capacitors or explosive flux compressors) can attain speeds up to several ten's of km/sec, so faster risetimes are possible. With either driver, a closing-switch at the output of the coil can be used to sharpen the voltage risetime at the load. In the case of plasma armatures, the implosion event may be repeated without refurbishing the device, so repetitive operation is possible. Such operation, with an appropriate repetitively-operated load, would allow extended suppression of targets.

It is an object of the present invention to provide a new design for a repetitive magnetic pulse generators.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

Figure 1:
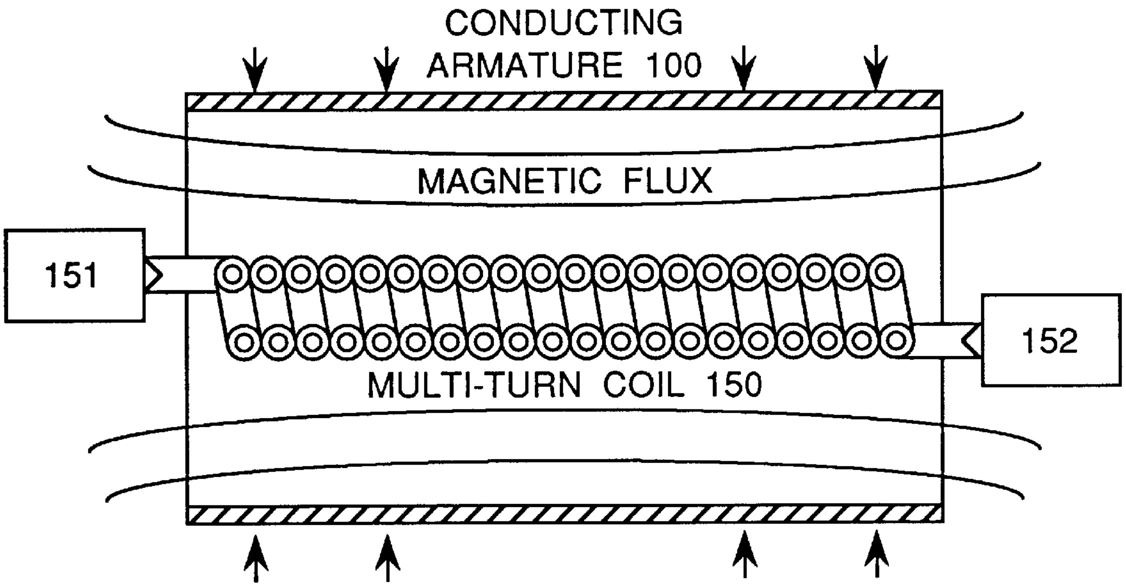
FIG. 1 is an illustration of the present invention using an imploding conductive armature.

The arrangement of the preferred embodiment is shown schematically in FIG. 1. FIG. 1 is an illustration of the present invention using an imploding conductive armature.

The present invention is a magnetic voltage-pulser (MVP) to drive high impedance loads, such as high power microwavegenerators, particle-beam diodes and antennas using: a power source 151 that produces a seed current and a seed magnetic field; a multi turn coil 150 that produces an output pulse when cut by the magnetic flux; an imploding armature 100 that surrounds the multi-turn coil and a means of imploding the annular armature. Implosion of an electrically-conducting cylinder ("armature") 100 compresses magnetic flux in an area surrounding a multi-turn, solenoidal coil 150. The rate-of-increase of axial magnetic field due to flux compression induces a high voltage difference between the ends of the coil. The risetime of the voltage is scaled by the coil radius divided by the armature speed. Solid-density armatures driven by gas pressure due to explosive burning can attain speeds of a few km/sec, providing microsecond risetimes with coils of several mm diameter.

Figure 2:
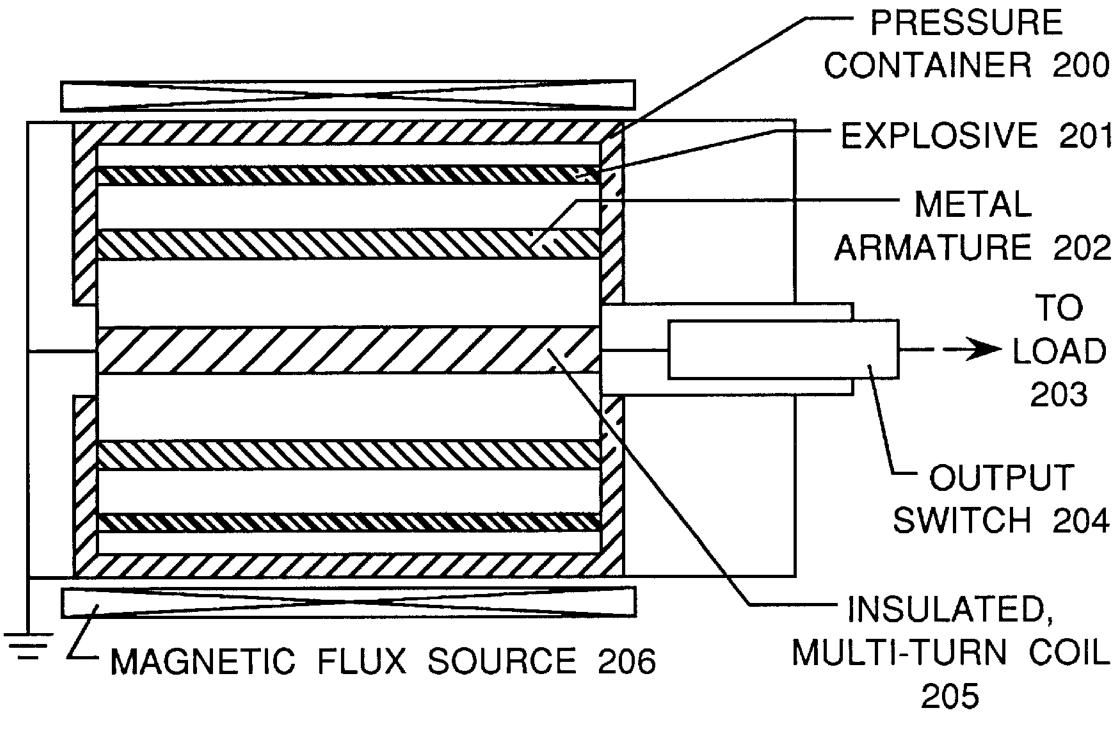
FIG. 2 is an illustration of the present invention using an explosive around an annular armature to implode it.

FIG. 2 is an illustration of the present invention using an explosive around an annular armature to implode it. It uses a pressure container 200, an explosive 201, a metal armature 202, an output switch 204, an insulated multi-turn coil 205 and a magnetic flux source 206.

Figure 3:
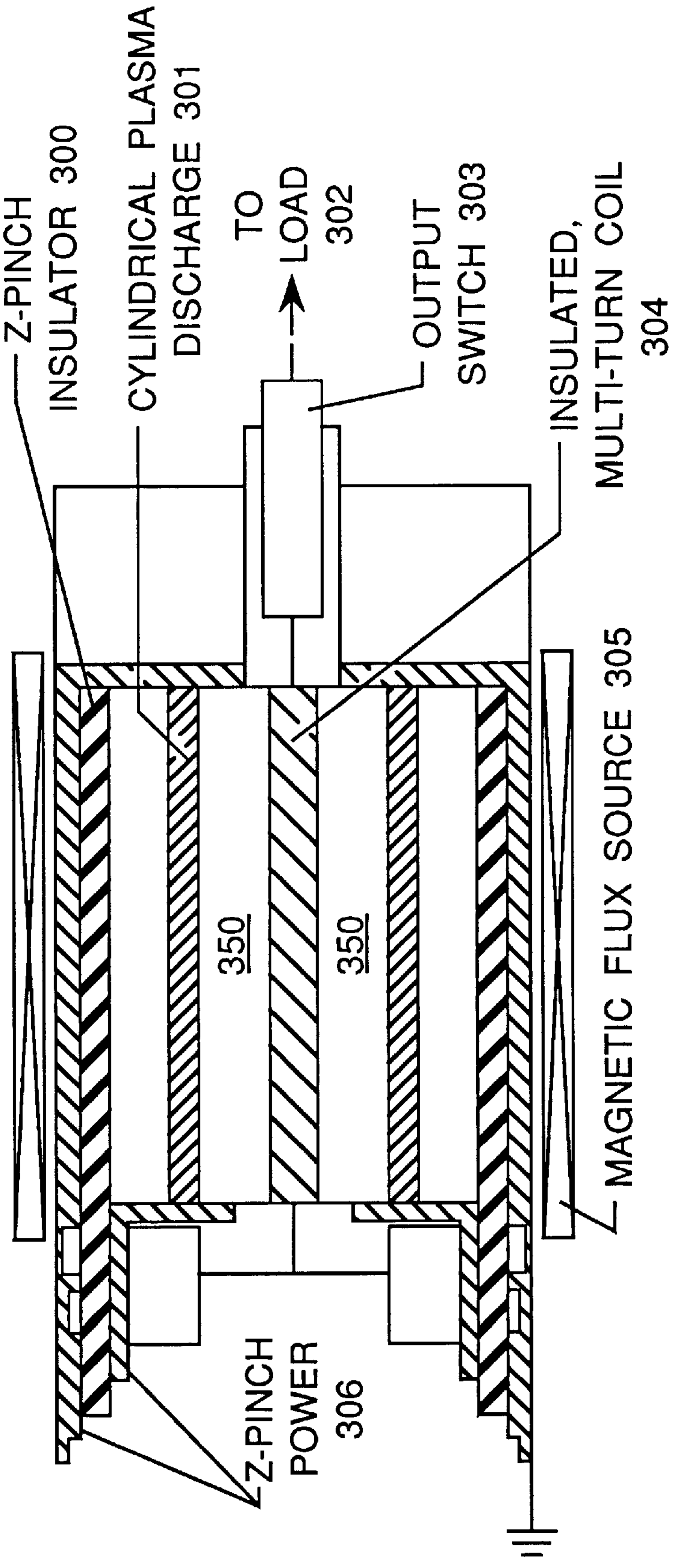
FIG. 3 is an illustration of the present invention using a cylindrical plasma discharge in place of an explosive around an annular armature to implode it.
Figure 4:
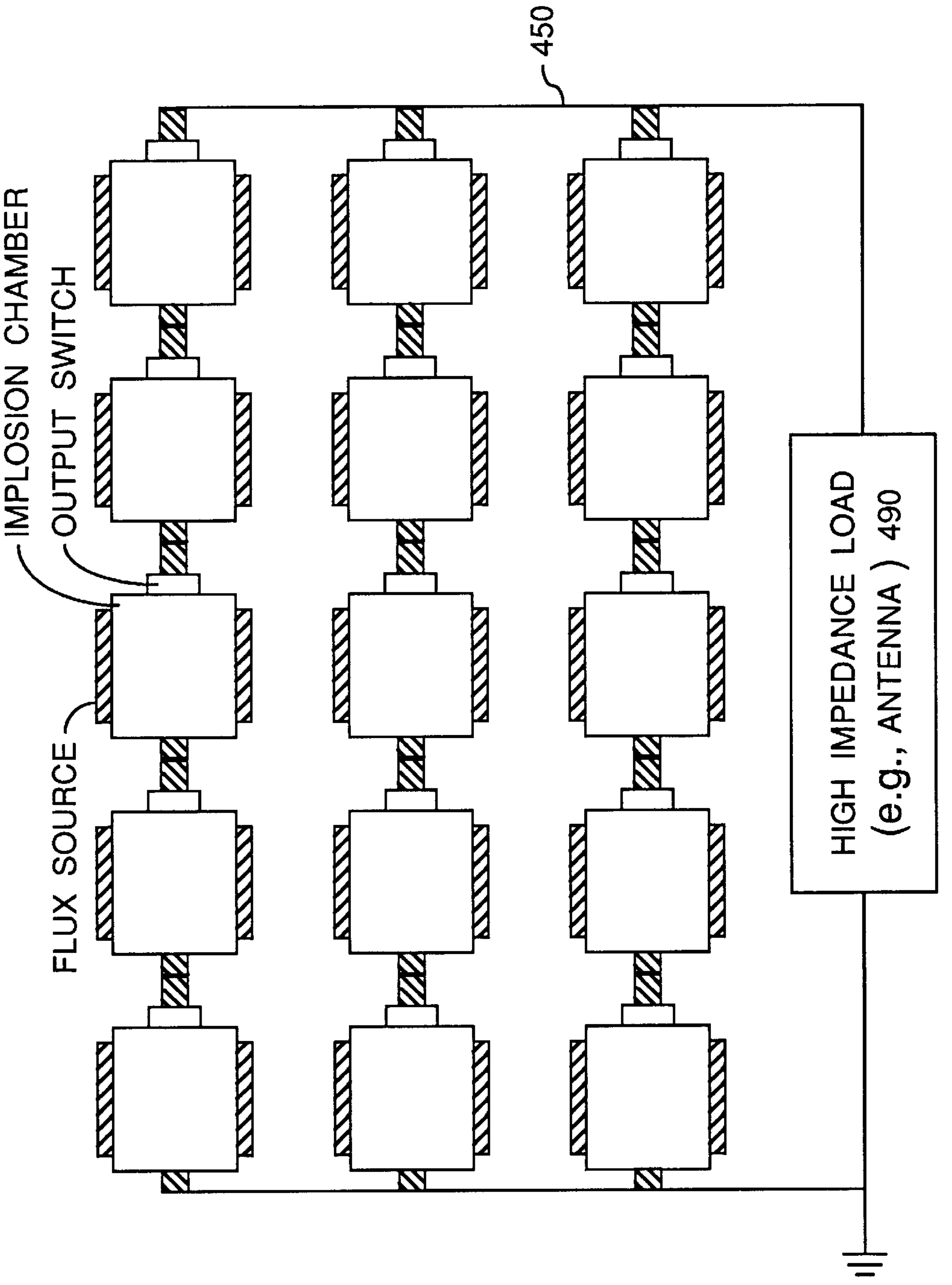
FIG. 4 is an illustration of an array of magnetic voltage pulsers with outputs that can be combined on a common bus.

FIG. 3 is an illustration of the present invention using a cylindrical plasma discharge 301 in place of an explosive around an annular armature 350 to compress magnetic flux; and FIG. 4 is an illustration of an array of magnetic voltage pulsers with outputs that can be combined on a common bus.

Metal or plasma armatures driven electromagnetically (by either capacitors or explosive flux compressors) can attain speeds up to several ten's of km/sec, so faster risetimes are possible. With either driver, a closing-switch at the output of the coil can be used to sharpen the voltage risetime at the load 152. In the case of plasma armatures, the implosion event may be repeated without refurbishing the device, so repetitive operation is possible.

The magnetic voltage-pulser (MVP) uses technology associated with relatively low impedance, high current sources (e.g., capacitors or explosively-driven magnetic flux compressors) to drive high impedance loads, such as high power microwavegenerators, particle-beam diodes and antennas. Implosion of an electrically-conducting cylinder ("armature") compresses magnetic flux in an area surrounding a multi-turn, solenoidal coil. The rate-of-increase of axial magnetic field due to flux compression induces a high voltage difference between the ends of the coil. The risetime of the voltage is scaled by the coil radius divided by the armature speed. Solid-density armatures driven by gas pressure due to explosive burning can attain speeds of a few km/sec, providing microsecond risetimes with coils of several mm diameter. Metal or plasma armatures driven electromagnetically (by either capacitors or explosive flux compressors) can attain speeds up to several ten's of km/sec, so faster risetimes are possible. With either driver, a closing-switch at the output of the coil can be used to sharpen the voltage risetime at the load. In the case of plasma armatures, the implosion event may be repeated without refurbishing the device, so repetitive operation is possible. Such operation, with an appropriate repetitively-operated load, would allow extended suppression of targets.

Typical parameters for a single Magnetic Voltage-Pulser are:

| | |
|---|---|
| Output voltage | 0.2 to 1.0 MV. Output impedance—1 to 10 ohms |
| Armature speeds | 2 to 40 km/s,—Peak magnetic fields—10 to 100 T |

FIGS. 1 to 5 display the basic arrangement, formulation and particular embodiments, including series/parallel arrangements for higher voltage and higher impedance loads, such as antennas.

The principal advantages of the Magnetic Voltage-Pulser over a typical, conventional source of high-voltage pulses, such as a Marx generator, are reductions of size, weight, and complexity. The reductions in size and weight are due to the ability to use chemical energy or (relatively) low voltage, high energy-density capacitors as the proximate source of energy for the dynamic-conductor motion that displaces magnetic flux. Size and weight reductions are also achieved because the space and material normally required for switching in Marx generators, or similar arrangements, is not needed in the MVP. A separate advantage of the MVP over transformer approaches is the ability to achieve reductions of the risetime and duration of the high voltage, output pulse relative to the low voltage, input pulse that powers the dynamic conductor.

Variations of the basic arrangement of the Magnetic Voltage-Pulser are depicted in FIGS. 1 and 3 through 5, and include the use of imploding cylinders (liners) of solid-density metal or low-density plasma, driven either by electromagnetic or gas dynamic forces. For the case of electromagnetically-driven implosions, the use of inductively-driven (theta-pinch style) liners vs implosions driven by direct-current (z-pinch style) may be advantageous because the axial length of the output coil can be increased to generate and support high voltages, while actually reducing the impedance presented to the drive circuit.

A single coil with multiple turns surrounding the axis of symmetry may be used to intercept the displaced magnetic flux. Alternatively, a plurality of multi-turn coils may be arrayed with axes parallel to the symmetry axis, and connected together in series/parallel fashion to achieve various output impedance values within a single implosion system.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A magnetic voltage pulser comprising:

a power source that produces a seed current and a seed magnetic field;

a multi-turn coil that produces a seed magnetic field when cut by magnetic flux;

an annular imploding armature that surrounds the multi-turn coil to compress the seed magnetic field to produce an output pulse;

a means of repetitively imploding the annular imploding armature.

2. A magnetic voltage pulser, as defined in claim 1, wherein said means of repetitively imploding the annular imploding armature comprises an imploding cylindrical plasma discharge that surrounds the multi-turn coil and which compresses the seed magnetic field that surrounds the multi-turn coil.

3. A magnetic voltage pulser, as defined in claim 1, further comprising an external magnetic field generator that surrounds the multi-turn coil and which exerts an induction thereon to increase the output produced by the multi-turn coil.

4. A magnetic voltage pulser, as defined in claim 2, further comprising an external magnetic field generator that surrounds the multi-turn coil and which exerts an induction thereon to increase the output produced by the multi-turn coil.

5. A magnetic voltage pulser comprising:

a power source that produces a seed current and a seed magnetic field;

an array of multi-turn coils that each produce a voltage when cut by magnetic flux;

an annular imploding armature that surrounds the array of multi-turn coils to compress the seed magnetic field to produce an output pulse;

a means of repetitively imploding the annular imploding armature.

6. A magnetic voltage pulser, as defined in claim 5, wherein said means of repetitively imploding the annular imploding armature comprises an imploding cylindrical plasma discharge that surrounds the array of multi-turn coils and which compresses the seed magnetic field that surrounds the multi-turn coil.

7. A magnetic voltage pulser, as defined in claim 5, further comprising an external magnetic field generator that surrounds the array of multi-turn coils and which exerts an induction thereon to increase the output produced by the array of multi-turn coils.

* * * * *